US008382456B2

(12) United States Patent
Scott

(10) Patent No.: US 8,382,456 B2
(45) Date of Patent: Feb. 26, 2013

(54) PUMP EXPANSION VESSEL

(75) Inventor: Alexander Robin Walter Scott, Okotoks (CA)

(73) Assignee: Coolit Systems Inc., Calgary (CA)

( * ) Notice: Subject to any disclaimer, the term of this patent is extended or adjusted under 35 U.S.C. 154(b) by 631 days.

(21) Appl. No.: 11/745,932

(22) Filed: May 8, 2007

(65) Prior Publication Data

US 2008/0236799 A1 Oct. 2, 2008

Related U.S. Application Data

(60) Provisional application No. 60/909,032, filed on Mar. 30, 2007.

(51) Int. Cl.
*F01D 25/28* (2006.01)
*H05K 7/20* (2006.01)

(52) U.S. Cl. .............................. 417/423.14; 361/679.53

(58) Field of Classification Search .................. 417/313, 417/701, 540, 423.1, 423.14, 543; 138/30; 361/679.53, 698, 699–703; 378/130, 141, 378/199, 200, 201, 202

See application file for complete search history.

(56) References Cited

U.S. PATENT DOCUMENTS

| | | | | | |
|---|---|---|---|---|---|
| 4,307,204 | A | * | 12/1981 | Vidal | 521/140 |
| 4,500,487 | A | | 2/1985 | Christie et al. | |
| 4,651,781 | A | | 3/1987 | Kandelman | |
| 4,823,844 | A | | 4/1989 | Bartholomew | |
| 4,950,133 | A | * | 8/1990 | Sargent | 417/312 |
| 5,325,944 | A | * | 7/1994 | Livingston, Sr. | 188/294 |
| 5,709,248 | A | | 1/1998 | Goloff | |
| 5,714,696 | A | * | 2/1998 | Yeamans | 73/863.84 |
| 5,967,623 | A | * | 10/1999 | Agnew | 303/87 |
| 6,074,092 | A | * | 6/2000 | Andrews | 378/200 |
| 6,076,557 | A | * | 6/2000 | Carney | 138/30 |
| 6,543,485 | B2 | | 4/2003 | Henry et al. | |
| 6,725,682 | B2 | | 4/2004 | Scott | |
| 6,971,243 | B2 | | 12/2005 | Scott | |
| 7,108,016 | B2 | | 9/2006 | Moskalik et al. | |
| 7,121,304 | B2 | | 10/2006 | Gray, Jr. | |
| 7,174,738 | B2 | | 2/2007 | Scott | |
| 2006/0204389 | A1 | * | 9/2006 | Weber et al. | 417/540 |

* cited by examiner

*Primary Examiner* — Devon Kramer
*Assistant Examiner* — Bryan Lettman
(74) *Attorney, Agent, or Firm* — Ganz Law, PC

(57) ABSTRACT

A pump can have a housing defining therein an inner chamber of fixed volume. An inlet through the housing can provide communication to the inner chamber and an outlet through the housing can provide communication to the inner chamber. A pumping mechanism can be positioned in the inner chamber. A resiliently, compressible member can accommodate a portion of the fixed volume of the inner chamber.

19 Claims, 2 Drawing Sheets

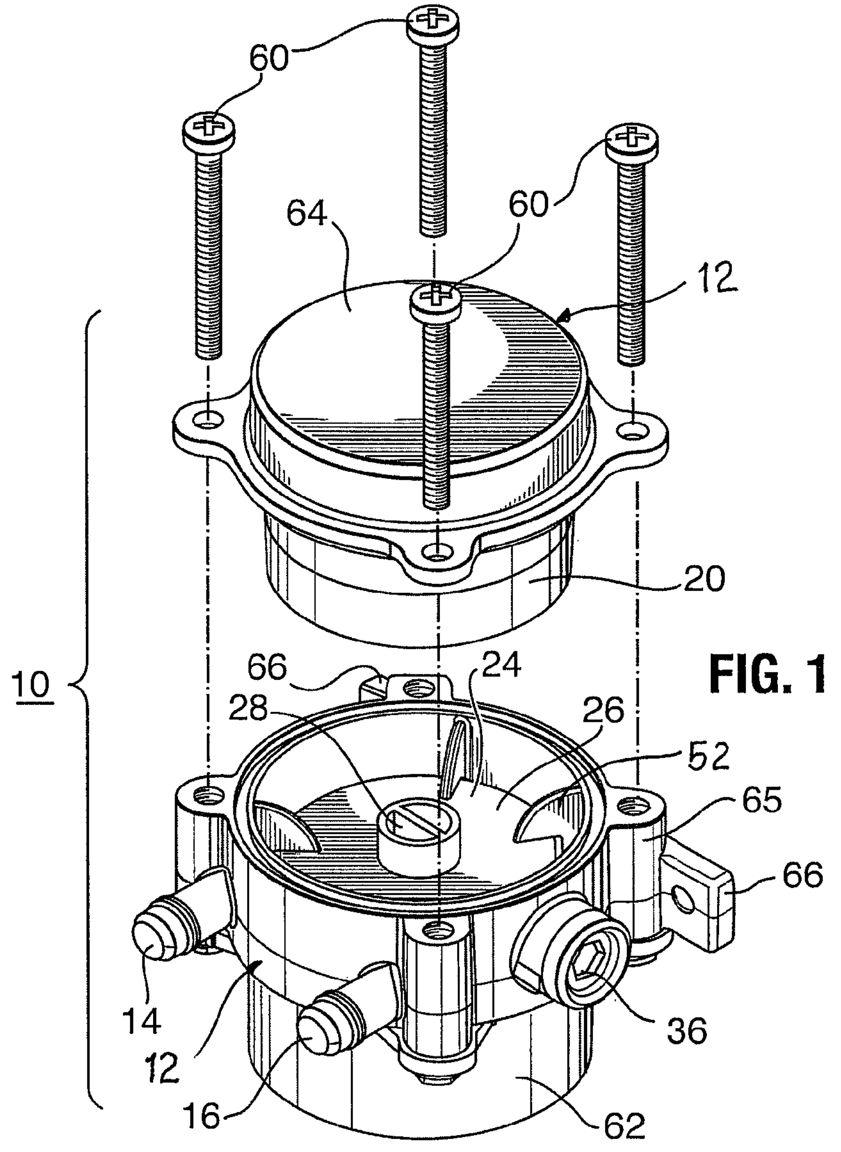
FIG. 1
FIG. 2
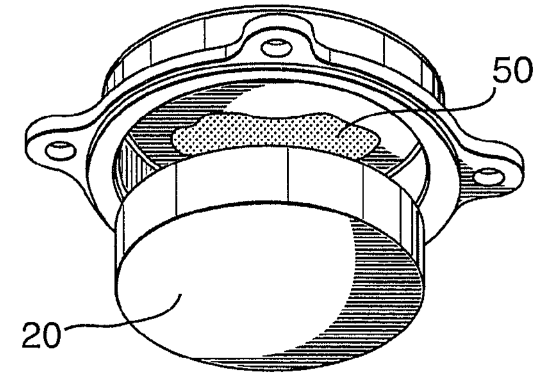

PUMP EXPANSION VESSEL

FIELD OF THE INVENTION

In a closed pump circuit such as may be used in a hydraulic system or for coolant in a refrigeration system, an expansion/reservoir vessel is used to store the pump fluid. The expansion/reservoir vessel must be able to accommodate coolant volume spikes. Previously, volume spikes caused by coolant expansion were accommodated in various ways, as by use of diaphragms in the wall of the vessel, etc.

In a computer liquid-cooling system, for example, the coolant may have significant volume changes through temperature variances as the system operates. If a closed pump circuit is desired to be employed, such volume spikes must be accommodated. For example, volume spikes are sometimes accommodated by pressure release diaphragms or valves.

SUMMARY OF THE INVENTION

In accordance with a broad aspect of the present invention, there is provided a pump including: a housing defining therein an inner chamber of fixed volume; an inlet through the housing providing communication to the inner chamber; an outlet through the housing providing communication to the inner chamber; a pumping mechanism in the inner chamber; and a resiliently, compressible member accommodating a portion of the fixed volume of the inner chamber.

In accordance with another broad aspect of the present invention, there is provided a computer cooling system including: a liquid cooled heat exchanger and a pump circuit providing liquid coolant to the liquid cooled heat exchanger, the pump circuit including a pump with an inlet and an outlet, a pump discharge tubing extending between the pump outlet and the heat exchanger, and a pump return tubing extending between the heat exchanger and the pump inlet; and a pump coolant expansion/reservoir vessel including: a rigid wall structure; an inner chamber of fixed volume within the rigid wall structure; a port in the rigid wall for communication to a pump circuit; and a resiliently, compressible member in the inner chamber In accordance with another broad aspect of the present invention, there is provided a computer cooling system including: a liquid cooled heat exchanger and a pump circuit providing liquid coolant to the liquid cooled heat exchanger, the pump circuit including a pump a housing defining therein an inner chamber of fixed volume; an inlet through the housing providing communication to the inner chamber; an outlet through the housing providing communication to the inner chamber; a pumping mechanism in the inner chamber; and a resiliently, compressible member accommodating a portion of the fixed volume of the inner chamber, a pump discharge tubing extending between the pump outlet and the heat exchanger, and a pump return tubing extending between the heat exchanger and the pump inlet.

It is to be understood that other aspects of the present invention will become readily apparent to those skilled in the art from the following detailed description, wherein various embodiments of the invention are shown and described by way of illustration. As will be realized, the invention is capable for other and different embodiments and its several details are capable of modification in various other respects, all without departing from the spirit and scope of the present invention. Accordingly the drawings and detailed description are to be regarded as illustrative in nature and not as restrictive.

BRIEF DESCRIPTION OF THE DRAWINGS

Referring to the drawings, several aspects of the present invention are illustrated by way of example, and not by way of limitation, in detail in the figures, wherein:

FIG. 1 is a top perspective view of a pump housing in exploded configuration;

FIG. 2 is a bottom perspective view of a pump reservoir cap in exploded configuration;

DETAILED DESCRIPTION OF VARIOUS EMBODIMENTS

The detailed description set forth below in connection with the appended drawings is intended as a description of various embodiments of the present invention and is not intended to represent the only embodiments contemplated by the inventor. The detailed description includes specific details for the purpose of providing a comprehensive understanding of the present invention. However, it will be apparent to those skilled in the art that the present invention may be practiced without these specific details.

Figure 3:
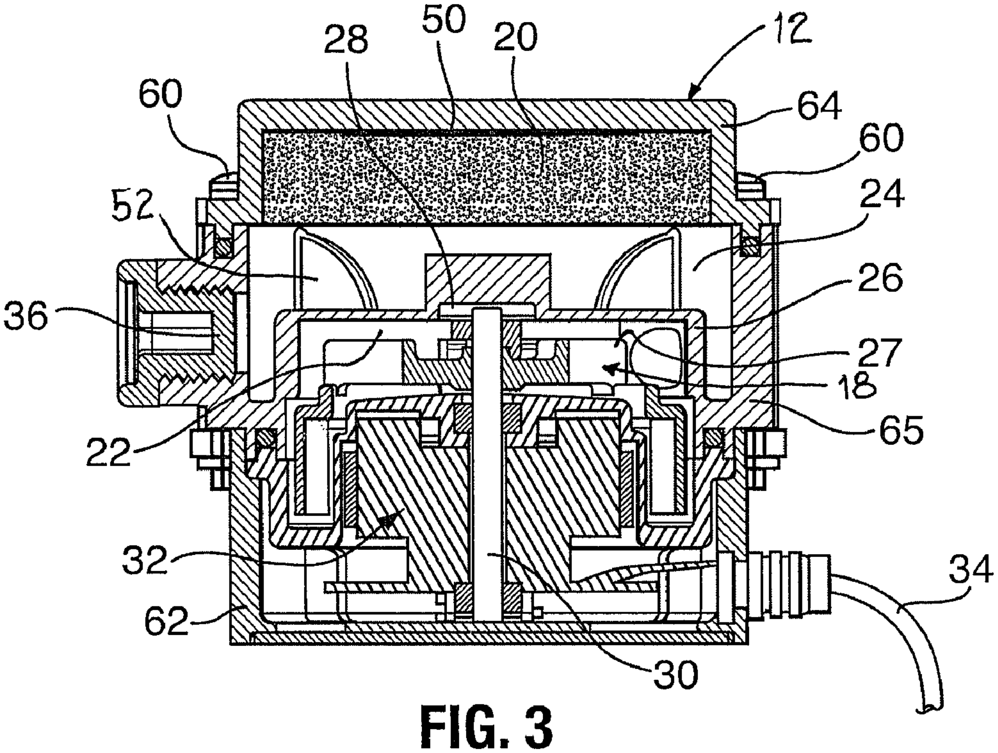
FIG. 3 is a sectional view through an assembled pump housing.

With reference to FIGS. 1 to 3, one embodiment of a pump 10 is shown. Although a description of one embodiment follows, it is to be understood that a pump and the various components thereof, according to the present invention, may be of and include various forms, constructions, materials, sizes and configurations, as will be appreciated.

Pump 10 includes a housing 12 defining therein an inner chamber. Housing 12 may be formed of substantially rigid materials such that the volume of inner chamber is substantially fixed. Pump 10 further includes an inlet 14 and an outlet 16 extending through the housing providing fluid communication to the inner chamber. Pump 10 further includes a fluid pumping mechanism 18 and a resiliently compressible member 20 in the inner chamber to accommodate coolant expansion causing volume spikes in the pump circuit.

In the illustrated embodiment, the inner chamber includes at least an impeller chamber 22 in which pumping mechanism 18 is positioned and a reservoir 24, in fluid communication with the impeller chamber. In the illustrated embodiment, impeller chamber 22 and reservoir 24 are formed from the same pump housing and are separated by a wall 26 with a port 28 therethrough for fluid communication between impeller chamber 22 and reservoir 24. In the illustrated embodiment, inlet 14 opens to reservoir 24 and outlet 16 opens from impeller chamber 22. Reservoir 24 is positioned to accumulate air in the pump circuit and to store excess coolant.

Pumping mechanism 18, in the illustrated embodiment, includes an impeller 27 rotatable on a shaft 30. Impeller 27 is driven by a motor 32 such as an electrically driven motor as shown. An electrical supply line 34 is provided for powering the pump.

Pump 10 may include a fill port 36 including for example a port and closure, such as a correspondingly threaded port and plug, through which coolant may be introduced to the pump circuit.

Figure 4:
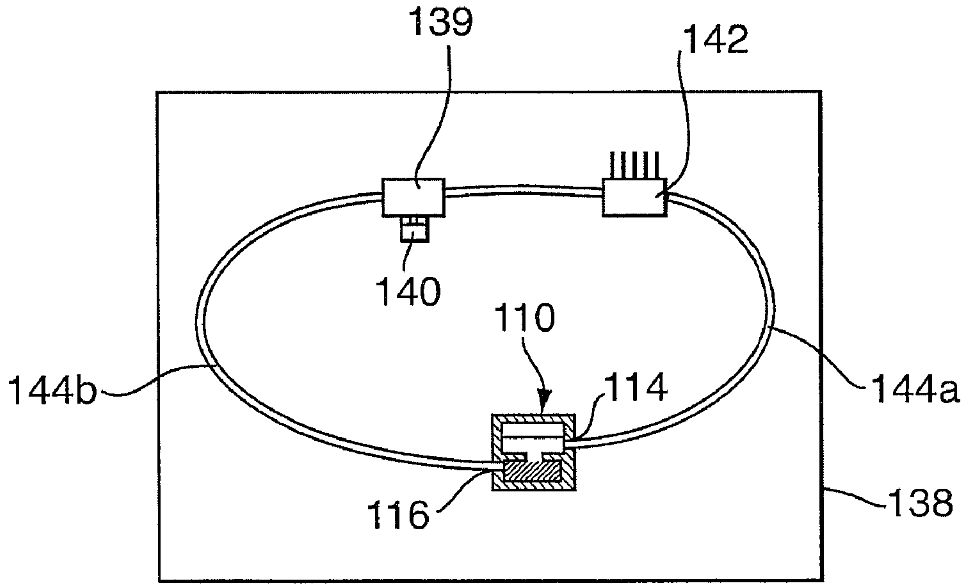
FIG. 4 is a schematic drawing of a pump circuit.

With reference to FIG. 4, a pump 110 such as, for example, that described in relation to FIGS. 1 to 3 may be used to move fluid through a pump circuit. For example, pump 110 may be used in a liquid cooled computer 138 to drive liquid coolant between heat exchangers such as a heat exchanger 139 in thermal communication with a heat source 140 and a heat sink 142. The pump's inlet 114 and outlet 116 may be formed as barbs, as shown in FIGS. 1 to 3, or in other ways for liquid tight connection of liquid tubing 144*a*, 144*b*. Pumping mechanism is capable of moving liquid coolant through the pump housing from the inlet to the outlet and through the discharge line 144*a* and the return line 144*b* such that the liquid coolant moves to accept thermal energy from a heat source 140 and unload that thermal energy at heat sink 142. Various examples of cooling systems, and in particular computer cooling systems and components thereof, are disclosed in U.S. Pat. Nos. 7,174,738, 6,971,243 and 6,725,682 of CoolIt Systems Inc., incorporated herein by reference.

In a computer cooling system, the coolant may be water, glycol, mixtures thereof or other liquids. Generally, the coolant is circulated to cool components such as chip sets, central processing units, etc. In some computer systems, the coolant may range in temperatures between −40° to and 85° C. in storage and between 0° and 90° C. in operation.

In the illustrated embodiment, the pump circuit is closed. To accommodate volume spikes caused by temperature changes and expansion of the coolant resiliently, compressible member 20 is provided in the inner chamber of the pump. In the illustrated embodiment, member 20 is positioned in reservoir 24. Member 20 may include, for example, one or more pieces of a closed cell sponge, also called closed cell foam. As will be appreciated, a closed cell sponge includes a material including a plurality of cells surrounded by material such that the cells are closed and the fluid within each cell is substantially trapped. The member accommodates space in the pump housing, but can be compressed by expansion of the coolant, as may be caused by an increase in coolant temperature, within the chamber. Compression of the sponge, increases the available volume for the coolant within the pump and the circuit to thereby avoid pressure spikes of the coolant within the circuit. Of course, during filling and refilling of the coolant, care may be taken to ensure that the sponge is not already fully compressed at ambient temperatures.

Member 20 may be formed from a polymer or other material that is resilient so that it can be compressed and substantially recover to its original volume repeatedly and is substantially resistant to break down in the environment of the pump circuit, with consideration to factors such as the temperatures, and prolonged contact with the liquid coolant. It is desirable that the material resist fluid crossover between the volumes of any closed cells of member 20 into the liquid coolant. In one embodiment, member 20 includes a synthetic rubber such as, for example, a polychloroprene such as is commonly known as Neoprene™ (Dupont Performance Elastomers).

Member 20 may be secured to the housing or may be loose in a chamber in the pump circuit. However, it is desired that the member remain substantially in position without blocking fluid flow through the pump circuit or the chamber in which it is positioned. Thus, in one embodiment member 20 may be secured to the housing inner walls defining the inner chamber. For example, the member may be fastened directly to the housing inner walls by adhesive 50 applied at interfacing surfaces, interlock, fasteners, etc. Alternately or in addition, a retainer may be formed or positioned within the chamber to hold the member in a position away from moving out of the chamber or into a blocking position against the fluid ports. For example, in the illustrated embodiment, protrusions such as ridges 52 and spacer are positioned to retain member in a spaced relation from inlet 14 and port 28, even if member 20 is or becomes loose in the reservoir chamber. In addition, or alternately, member 20 may be selected to be large enough, such as by forming as one piece and/or with consideration as to the sizes of any ports to the chamber in which it is positioned, such that it cannot pass through any ports.

As noted previously a pump according to the present invention and its components may be of and include various forms, constructions, materials, sizes and configurations, as will be appreciated. In the illustrated embodiment, for example, housing 12 may be formed as a plurality parts and secured by fasteners 60. For example, as shown, housing may be formed in a part 62 accommodating the motor, a cap 64 defining a portion of the reservoir 24 and a mid portion 65 on either side of which the parts 62 and 64 are mounted. Such a housing arrangement provides for ease of assembly and manufacture, as the reservoir can be accessed for insertion of member 20 and motor 32 and impeller 27 can be mounted in part 62 before the housing parts are fastened together.

To facilitate use and installation, housing 12 may include mounting structures such as apertured tabs 66 for accepting mounting fasteners.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are know or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

The invention claimed is:

1. A computer cooling system comprising:

a heat exchanger and a pump circuit configured to provide a liquid coolant to the heat exchanger, the pump circuit including:

a pump including a housing defining therein an inner chamber having a fixed volume, the inner chamber including at least an impeller chamber and a reservoir, the impeller chamber and the reservoir being positioned directly adjacent to each other in the pump housing, separated from each other by a wall and in fluid communication with each other through a port in the wall;

an inlet through the housing opening to the reservoir, apart from the port;

an outlet through the housing opening from the impeller chamber, apart from the port;

a pumping mechanism in the impeller chamber;

a resiliently compressible member in the reservoir accommodating a portion of the fixed volume of the inner chamber, wherein the resiliently compressible member is compressible in response to expansion of the liquid coolant;

a retainer positioned in the inner chamber and configured to hold the resiliently compressible member in a position away from moving out of the inner chamber or into a position blocking fluid flow through the pump, wherein the retainer and the wall separating the impeller chamber and the reservoir are integrally formed to define a unitary construction;

a separable cap, apart from the resiliently compressible member, defining a recessed inner wall in fluid communication with the reservoir;

a pump discharge tubing extending between the pump outlet and the heat exchanger; and a pump return tubing extending between the heat exchanger and the pump inlet, the pump circuit providing the liquid coolant to the heat exchanger in a closed loop driven by the pumping mechanism including a flow path through the pump inlet into the reservoir, past the resiliently compressible member and out the port into the impeller chamber.

2. The computer cooling system of claim 1 wherein the reservoir is positioned to accumulate air in the pump housing and to store excess liquid coolant.

3. The computer cooling system of claim 1 wherein the pumping mechanism includes an impeller driven by an electrical motor.

4. The computer cooling system of claim 1 wherein the resiliently compressible member includes at least one piece of a closed cell sponge.

5. The computer cooling system of claim 1 wherein the resiliently compressible member includes a polychloroprene material.

6. The computer cooling system of claim 1 wherein the resiliently compressible member is secured to the housing.

7. The computer cooling system of claim 1 wherein the resiliently compressible member is loose in the inner chamber.

8. The computer cooling system of claim 1 wherein the resiliently compressible member is fastened directly to one or more inner walls of the housing by an adhesive.

9. The computer cooling system of claim 1 wherein the retainer is an extension integral to the housing.

10. The computer cooling system of claim 1 wherein the retainer includes a protrusion extending within the housing.

11. The computer cooling system of claim 1 wherein the pump circuit operates to cool an electronic heat source.

12. The computer cooling system of claim 1 wherein the housing includes a base defining a portion of the impeller chamber and a mid portion between the base and the cap, the mid portion and cap being secured by fasteners and being openable for access to the resiliently compressible member.

13. The computer cooling system of claim 1 wherein the retainer is positioned protruding out from about the port to hold the resiliently compressible member in a spaced relation from the port.

14. The computer cooling system of claim 1 wherein the resiliently compressible member and the retainer urge against each other regardless of a degree of expansion or contraction of the cooling liquid.

15. The computer cooling system of claim 12 wherein the mid-portion of the housing is matingly engageable with the cap and the base member.

16. The computer cooling system of claim 1 wherein the resiliently compressible member is positioned at least partially within a recess defined by the cap.

17. A cooling system for a computer, wherein the cooling system comprises:

a heat exchanger and a pump;

a housing defining an impeller chamber and a reservoir, wherein the impeller chamber and the reservoir are positioned directly adjacent to each other in the housing and separated from each other by a housing wall defining a port configured to fluidicly couple the impeller chamber and the reservoir with each other, wherein the housing comprises:

a base member, a cap defining a recess at least partially defining the reservoir, and a mid-portion positioned between and mechanically coupled with the cap and the base member;

wherein a portion of the pump is positioned within the impeller chamber, and wherein a portion of the wall separating the impeller chamber and the reservoir from each other defines a retainer; and a resiliently compressible member positioned in the recess defined by the cap and configured to resiliently compress in response to a volumetric expansion of a liquid coolant, wherein the retainer is configured to prevent the resiliently compressible member from blocking a fluid flow through the port in the housing wall.

18. The computer cooling system of claim 17, wherein the recess defined by the cap comprises a first recess and wherein the mid-portion defines a second recess at least partially defining the impeller chamber.

19. The computer cooling system of claim 17, wherein the retainer is positioned transverse relative to the resiliently compressible member.

* * * * *